United States Patent [19]

Jorden et al.

[11] Patent Number: 4,965,699
[45] Date of Patent: Oct. 23, 1990

[54] CIRCUIT CARD ASSEMBLY COLD PLATE

[75] Inventors: Ralph Z. Jorden, Cherry Hill, N.J.; Ronald S. Lenig, Corrales, N. Mex.

[73] Assignee: Magnavox Government and Industrial Electronics Company, Fort Wayne, Ind.

[21] Appl. No.: 339,568

[22] Filed: Apr. 18, 1989

[51] Int. Cl.$^5$ .............................................. H05K 7/20
[52] U.S. Cl. ................................... 361/387; 165/80.3; 361/405
[58] Field of Search ............... 361/385, 388, 387, 383, 361/380, 400, 405; 357/81; 174/16.3; 165/80.3, 185

[56] References Cited

U.S. PATENT DOCUMENTS

| | | | |
|---|---|---|---|
| 4,254,447 | 3/1981 | Griffis | 361/389 |
| 4,266,267 | 5/1981 | Ruegg | 174/16.3 |
| 4,498,119 | 2/1985 | Cronin | 361/386 |
| 4,675,784 | 6/1987 | Dahlberg | 361/387 |
| 4,682,269 | 7/1987 | Pitasi | 174/16.3 |
| 4,709,301 | 1/1987 | Yamaguti | 361/387 |

FOREIGN PATENT DOCUMENTS 1397181  6/1975  United Kingdom ............... 174/16.3

*Primary Examiner*—Gerald P. Tolin
*Attorney, Agent, or Firm*—Roger M. Rickert; Thomas A. Briody; Richard T. Seeger

[57] ABSTRACT

Shock mounting and enhanced conductive cooling of electrical components on printed circuit cards are achieved by mounting the non-component surface of the circuit card to a cold plate with a viscous, heat conductive, electrically insulating material sandwiched between the cold plate and circuit card. The cold plate may be an aluminum plate with a thermally conductive, electrcially insulative anodized surface. Typically, the cold plate is attached to a chassis of electrical equipment, or to a similar heat sink.

5 Claims, 2 Drawing Sheets

FIG_1

CIRCUIT CARD ASSEMBLY COLD PLATE

SUMMARY OF THE INVENTION

The present invention relates generally to methods and processes for mounting electrical circuit components and more particularly to such mounting techniques employing unique heat dissipating features. More particularly, the present invention relates to a heat sink or cold plate for conducting heat away from electronic components on a printed circuit board to maintain the temperature of those components within safe operating limits. The intended environment of the present invention is in a airborne and similar electronic equipment. The device may be used in other environments where component cooling by air circulation is inadequate or, for some reason, not practical.

One conventional approach to the problem of mounting a circuit board having a number of integrated circuit chips, and/or discrete components thereon while providing adequate dissipation of the heat generated by those components is simple forced or convection circulation of air about the circuit board to cool the components. Such air circulation cooling is frequently inadequate where either high density packing of circuit components on the circuit board or high power circuit components are employed.

Heat dissipation for discrete circuit components beyond that attainable by simple air circulation around the component is frequently accomplished by directly mounting the circuit component to a "heat sink" or "cold plate" in the form of a thermally conductive metal plate or simply the chassis of the piece of electrical equipment. U.S. Pat. No. 4,266,267 is illustrative of the technique for such discrete components and shows bolts clamping a transistor to a heat conducting plate.

Heat disspation approaches for multicomponent printed circuit cards or boards for which air circulation cooling is not adequate conventionally employ a copper or aluminum plate which is adhered to the component side of the circuit board with the plate having holes or slots cut in to accommodate the circuit component leads. Such cold plates have, in the past, been mounted on the component side of the circuit board prior to insertion of the electronic components. Such prior cold plates have slots cut into them to provide clearance for the component leads, and are affixed to the circuit board using a thermally conductive epoxy adhesive. The heat passes from the electrical component to the cold plate through the plastic or ceramic component package. Thus, with this conventional arrangement, heat is removed from a circuit component through the case (typically the bottom surface) of the component. Moreover, the heat dissipating plate is of a specific configuration to match the particular circuit board. U.S. Pat. No. 4,675,784 is illustrative of this approach. This patented scheme employs a hard anodized aluminum heat dissipating plate having an oxide (anodized) coating which is highly heat conductive but electrically non-conductive. The French EPC No. 0,090,727 patent similarly shows components 5 mounted to a heat sink 2 with the component leads extending through the heat sink and then contacting the circuit board.

A number of variations on this conventional approach have also found their way into the literature. U.S. Pat. No. 4,682,269 to Pitasi shows components 12 mounted to one side of ceramic plate 10 with leads passing through the plate. An adhesive layer 22 separtes the plate 10 from a heat conducting alumina plate 20. Heat conducting metal pins 24 extend from plate 20. U.S. Pat. No. 4,498,119 to Cronin shown a pair of pinted circuit boards 122 having their back surfaces, that is, the surfaces opposite the surface to which the electronic components are attached, fixed to an aluminum heat conducting plate 120. The component leads do not pass through the boards 122 and whatever circuit component generated heat which is dissipated by the heat conducting plate must reach that plate by conduction through the circuit board.

In contradistinction to these prior techniques, the cold plate according to the present invention is a hard anodized aluminum plate having an oxide (anodized) coating which is highly heat conductive but electrically non-conductive. This cold plate is mounted to the non-component side of the circuit board with the electronic components on one side and heat conducting plate on the opposite side and in close proximity to the component leads which extend through the board. Heat passes from the components to the cold plate through the electrical leads and a silicone layer. The general heat flow path is shwon by the arrows on the drawing.

Such rear mounting of the cold plate provides a number of surprising results. These include superior heat transfer capabilities as compared to the above described conventional front mounting technique. One rear mounted cold plate will fit any circuit card to given length and width regardless of the component configuration on the card since no cut-outs for the component leads are required. The rear mounted cold plate may be retrofitted to existing air cooled circuit cards or boards, converting them to conduction cooled boards. Similarly, removal of the rear mounted cold plate, repair or maintenance of the borad or board components, and replacement of the cold plate is readily accomplished. Omission of the cut-outs results in significantly reduced cold plate cost.

The conventional front mounting cold plate requires certain components, depending on the number and configuration of their leads, to be placed in a particular orientation. For example, Dual In-line Package (DIP) components and other components with a significant number of leads positioned in a line frequently must be disposed on the circuit or wiring board and cold plate with their longes axis (line of the several leads) parallel to the desired direction of heat flow. The rear mounted cold plate, having no holes or cut-outs for the in-line conductors from such DIP's or similar integrated circuit components, allows the component to be mounted in any desired orientation thereby facilitating greater component density on a given size circuit card.

One object of the present invention is to provide heat dissipation along the non-component side of a circuit board.

Another object of the present invention is to provide a heat dissipating cold plate which is universally adaptable to circuit board of given dimensions.

In a typical environment, several circuit cards will be mounted parallel to one another and the components on the component side of one circuit card will radiate a significant amount of heat to the non-component side, i.e., the cold plate of the adjacent circuit card. The type III anodize (hardcoat) on the cold plates leaves microfissures on the surfaces which enhances the emissivity of the aluminum thus enhancing the heat transfer through radiation.

A further object of the present invention is the general improvement in heat transfer from a cirucit card.

A still further object of the present invention is the provision of a cold plate for a circuit card which is easily positioned and easily removed.

A thermally conductive, electrically insulating silicone elastomer may be positioned intermediate the cold plate and the non-component side of the circuit board. This layer provides a viscous vibration damping between the chassis supported cold plate and the circuit card.

Accordingly, it is another object of the present invention to provide improved vibration damping in the mounting of circuit cards.

These as well as other objects and advantageous features of the present invention will be in part apparent and in part pointed out hereinafter.

In carrying out the present invention in one form thereof, there is provided a thermally conductive electrically insulating silicone elastomer coating on the non-component surface of a printed circuit board. A heat dissipating member such as an anodized aluminum plate having a generally flat surface is placed in good thermal contact with the silicone elastomer coating whereby heat generated by an electrical circuit component is conducted by the component leads from the component to the elastomer coating and then conducted by the elastomer coating from the component leads to the heat dissipating member. A spacer in the form of a metallic plate of a preferred thickness is interposed between a limited portion of the heat dissipating member and a limited portion of the surface of the circuit board opposite the side having the electrical components to maintain the separation between the circuit board and heat dissipating member at the preferred thickness, which thickness is sufficient to insure separation between the electrical leads and the heat dissipating member.

In accordance with another form the invention, circuit components are mounted by preliminarily obtaining a circuit card and a metallic plate having at least one generally flat surface of about the same length and width as the circuit card. The metallic plate is first surface treated to form on the generally flat surface an electrically insulating, thermally conductive coating and then a silicone primer is applied to the surface treated genrally flat surface. Circuit components are mounted on one side of the circuit card with circuit component electrical leads extending through the circuit card and beyond the other side of the card. A layer of a thermally conductive electrically insulating silicone elastomer material is then sandwiched between the primed, surface treated generally flat surface and the other (non-component) side of the circuit card. The silicone primer is applied exclusively to the generally flat surface (not to the circuit card) to thereby facilitate subsequent separation of the metallic plate and layer of silicone elastomer material on the one hand, from the circuit card and electrical components on the other. Typically, the metallic plate is formed primarily of aluminum and the step of surface treating comprising hard anodizing at least the flat surface of the plate.

BRIEF DESCRIPTION OF THE DRAWING

Corresponding reference characters idicate corresponding parts throughout the several views of the drawing.

The exemplifications set out herein illustrate preferred embodiments of the invention in specific forms thereof and such exemplifications are not to be construced as limiting the scope of the disclosure or the scope of the invention in any manner.

DESCRIPTION OF THE PREFERRED EMBODIMENT

Figure 1:
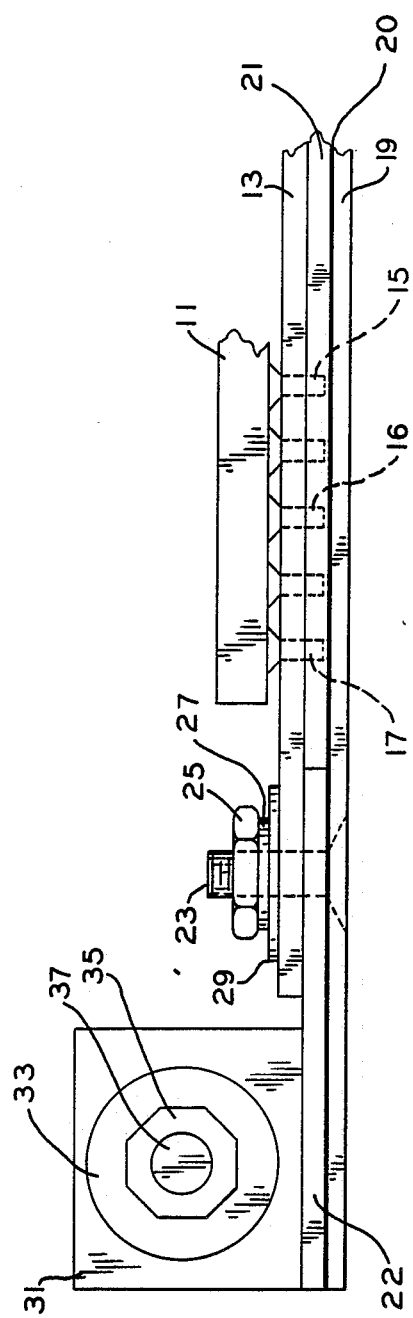
FIG. 1 is a side elevation view of a portion of an illustrative circuit borad, mounted circuit component, and cold plate illustrating the invention in one form.

Referring to FIG. 1, the heat source 11 may be a memory chip, some other type of integrated circuit component, or other electrical component which generates some heat when operating. The heat source 11 has a number of leads or terminals such as 15, 16 and 17 which extend from one surface of the component. These leads extend through holes in the printed circuit card 13 and are connected to other conductors and other circuit components by soldering and other conventional printed circuit board techniques. Thus, the component 11 and the upper or component side of the printed circuit card 13 may be conventional.

The bottom or non-component side of printed circuit card 13 is in contact with a layer of a thermally conductive silicone elastomer 21. The layer 21 of elastomer, which is a good electrical insulator, is sandwiched between the circuit board 13 and a cold plate 19. Cold plate 19 is a simple flat plate of aluminum with a least one and preferabley both flat surfaces type III hard anodized to from an oxide surface coating which is a good heat conductor yet a poor electrical conductor.

In one preferred embodiment, the elastomer 47 forming layer 21 was a TC-100 uncured silicone rubber available from CHR Industries of New Haven Ct. This illustrative material exhibits a thermal conductivity of about $3.4 \times 10^{-3}$. The layer 21 was about 0.063 inches in thickness. The elastomer was used in conjunction with an SR 500 primer available from General Electric Co. Silicone Products Div. of Waterford, N.Y. which was applied to the surface of the cold plate, but not to the surface of the printed circuit card. The cold plate itself in this illustrative preferred embodiment was an approximately five by seven inch rectangle and about 0.031 inches in thickness, but the invention contemplates thickness ranging from this figure up to about 0.093 inches.

The cold plate 19 and printed circuit card 13 are clamped to opposite sides of an aluminum spacer 22 by bolt 23 passing through cold plate 19, spacer 22, circuit card 13, washer 29, lock washer 27, and finally engaging nut 25. The spacer 22 defines and maintains the thickness of elastomer 21 and the corresponding separation between the cold plate 19 and circuit card 13. A similar spacer (not shown) may be located at the opposite end of the circuit card. In the abovenoted preferred embodiment, there was such a similar spacer and three bolts were employed at each end of the cold plate.

The spacer 22 comprises one arm of an L-shaped bracket 31 which in turn is attached to a mechanically solid heat sink by bolt 37 and nut 35. Bracket 31 function to mechancanlly fasten the circuit card to a chassis or other fixed support and also functions to provide a good heat flow path from the cold plate 19 to the chassis of the electrical equipment.

Figure 2:
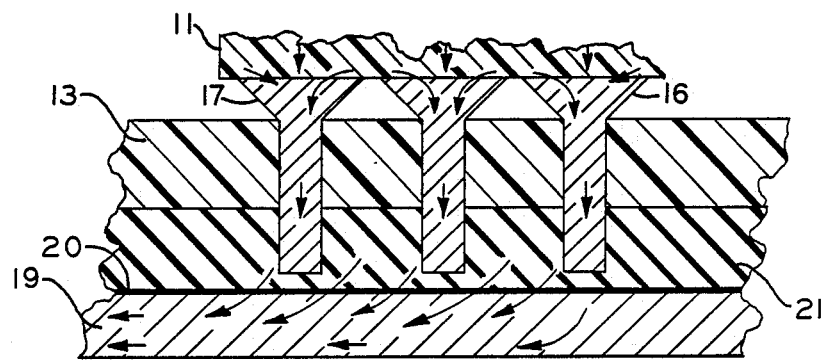
FIG. 2 is an enlarged view in cross-section of a portion of the circuit card assembly of FIG. 1 depicting heat dissipation according to one form of the present invention.

Referring now primarily to FIG. 2, the several electrical component leads 15, 16 and 17 are both good heat and good electrical conductors while the printed circuit card 13 is both a poor heat and a poor electrical conductor. Thus, heat generated within the circuit component 11 is funneled downwardly into the several leads. The elastomer layer 21 is a poor electrical conductor, but a good heat conductor. Thus, heat flow in the lower portions of the leads begins to spread out into the elastomer and across the anodized boundary 20. Since the cold plate 19 is fastened to a relatively cold heat sink such as the chassis of the electrical equiment, heat flow along this cold plate is directly toward that heat sink.

Figure 3:
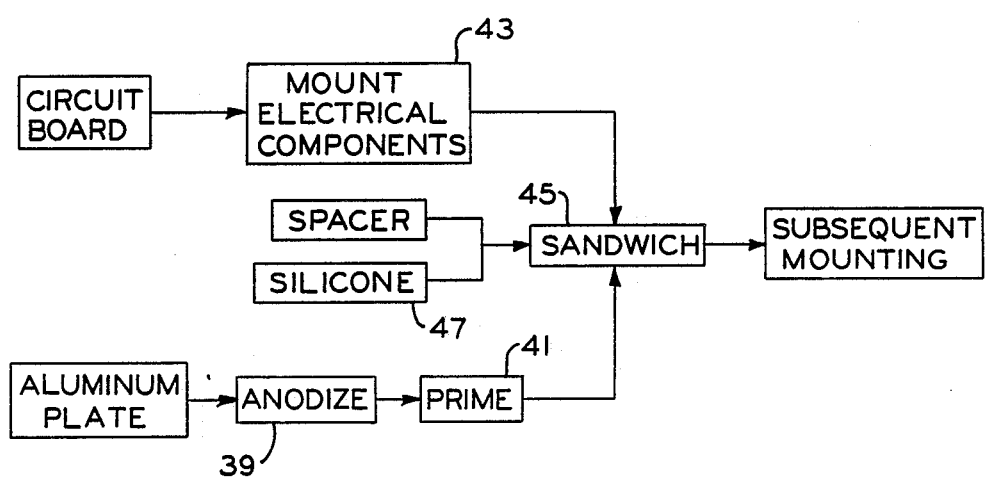
FIG. 3 is a schematic illustration of a preferred technique for practicing the present invention in one form.

The sequence of events in the practice of the present invention may be easily followed by comparing FIGS. 1 and 3. A circuit card 13 of covnentional consturction is obtained as is a metallic plate 19 having at least one (the upper as depicted) generally flat surface of about the same length and width as the circuit card. The plate 19 is typically primarily aluminum. Plate 19 is next surface treated, for example, by hard anodizing the surface 20. The anodizing 39 of the surface of the metallic plate forms, at least on the one generally flat surface, an electrically insulating, thermally conductive coating 20. A black type 3, class 2 anodize about 0.003 inches in thickness been found suitable. This is followed by the application 41 of a silicone primer to the surface 20. Meanwhile, the mounting 43 of the circuit components such as 11 on one side of the circuit card 13 with the circuit component electrical leads 15, 16 and 17 extending through the circuit card and beyond the other side has been accomplished.

A layer 21 of a thermally conductive electrically insulating silicone elastomer material is now sandwiched at 45 between the primed, surface treated generally flat surface 20 and the non-component side of the circuit card. This sandwiching or interposing inlcudes the insertion of a spacer metallic plate of a preferred thickness which is interposed between a limited portion of the primed, surface treated generally flat surface 20 and a corresponding limited portion of the non-component side of the circuit card to maintain the separation therebetween at the preferred thickness. The preferred thickness is sufficient to insure separation between the electrical leads such as 15 and the surface treated generally flat surface 20 of the metallic plate 19. The silicone primer of step 41 is applied exclusively to the surface 20 and not to the surface of the printed circuit card. This is to facilitate subsequent separation of the metallic plate and layer of silicone elastomer material from the circuit card and electrical components allowing ready access to the components for circuit repair or modification.

From the forgiong, it is now apparent that a novel arrangement has been disclosed meeting the objects and advantageous features set out hereinbefore as well as others, and that numerous modifications as to the precise shapes, configurations and details may be made by those having ordinary skill in the art without departing from the spirit of the invention or the scope thereof as set out by the claims which follow.

What is claimed is:

1. In combination with a circuit board having electrical components mounted on one side thereof with electrical component leads extending therethrough, a thermally conductive electrically insulating coating on the surface of the circuit board opposite the side having the electrical components, and a heat dissipating member having a generally flat surface in good thermal contact with the coating whereby heat generated by an electrical circuit component is conducted by the component leads from the component to the coating and then conducted by the coating from the component leads to the heat dissipating member.

2. The combination of claim 1 wherein the heat dissipating member comprises an anodized aluminum plate.

3. The combination of claim 2 wherein the anodiaed aluminum plate has an electrically insulating oxide surface coating about three one-thousandths of an inch in thickness.

4. The combination of claim 1 further comprising a metallic plate of a preferred thickness interposed between a limited portion of the heat dissipating member and a limited portion of the surface of the circuit board opposite the side having the electrical components to maintain the separation therebetween at the preferred thickness, the preferred thickness being sufficient to insure separation between the electrical leads and the heat dissipating member.

5. The combination of claim 3 wherein a preferred thickness of the anodized aluminum plate is about six hundredths of an inch.

* * * * *